United States Patent
Xing et al.

(10) Patent No.: US 12,202,975 B2
(45) Date of Patent: Jan. 21, 2025

(54) THERMALLY CONDUCTIVE SILICONE POTTING COMPOSITION

(71) Applicant: Henkel AG & Co. KGaA, Duesseldorf (DE)

(72) Inventors: Wentao Xing, Shanghai (CN); Yizhen Wang, Shanghai (CN); Hao Wu, Shanghai (CN); Xueyu Qiu, Shanghai (CN); Xinyu Zhang, Shanghai (CN); Xingyu Zhu, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 636 days.

(21) Appl. No.: 17/496,895

(22) Filed: Oct. 8, 2021

(65) Prior Publication Data

US 2022/0025181 A1 Jan. 27, 2022

Related U.S. Application Data

(63) Continuation of application No. PCT/CN2019/082001, filed on Apr. 10, 2019.

(51) Int. Cl.
| | |
|---|---|
| C08L 83/04 | (2006.01) |
| C08G 77/00 | (2006.01) |
| C08G 77/08 | (2006.01) |
| C08G 77/12 | (2006.01) |
| C08G 77/20 | (2006.01) |
| C08K 3/22 | (2006.01) |
| C09J 183/04 | (2006.01) |

(52) U.S. Cl.
CPC .............. *C08L 83/04* (2013.01); *C08G 77/08* (2013.01); *C08G 77/12* (2013.01); *C08G 77/20* (2013.01); *C08G 77/70* (2013.01); *C08K 3/22* (2013.01); *C09J 183/04* (2013.01); *C08K 2003/2227* (2013.01); *C08K 2201/001* (2013.01); *C08K 2201/003* (2013.01); *C08L 2203/20* (2013.01)

(58) Field of Classification Search
CPC ..... C08L 83/04; C08L 2203/20; C08G 77/08; C08G 77/12; C08G 77/20; C08G 77/70; C08K 3/22; C08K 2003/2227; C08K 2201/001; C08K 2201/003; C08K 2201/014; C08K 5/54; C09J 183/04; H01L 23/3737; H01L 23/296
USPC ........................................................ 524/437
See application file for complete search history.

(56) References Cited

U.S. PATENT DOCUMENTS

| | | | |
|---|---|---|---|
| 9,424,977 B2 | 8/2016 | Iwata et al. | |
| 9,718,925 B2 | 8/2017 | Jiang et al. | |
| 9,796,898 B2 | 10/2017 | Fang et al. | |
| 9,944,831 B2 | 4/2018 | Morita et al. | |
| 10,913,879 B2 | 2/2021 | Bai et al. | |
| 11,549,043 B2 | 1/2023 | Ota et al. | |
| 2006/0094809 A1 | 5/2006 | Simone et al. | |
| 2012/0123054 A1* | 5/2012 | Matsumoto | C08K 3/22 524/786 |
| 2016/0068732 A1 | 3/2016 | Kitazawa | |

FOREIGN PATENT DOCUMENTS

| | | |
|---|---|---|
| CN | 1443806 A | 9/2003 |
| CN | 101665623 A | 3/2010 |
| CN | 101724270 A | 6/2010 |
| CN | 101812233 A | 8/2010 |
| CN | 103214853 A | 7/2013 |
| CN | 106029803 A | 10/2016 |
| CN | 106753205 A | 5/2017 |

(Continued)

OTHER PUBLICATIONS

International Search Report for International PCT Patent Application No. PCT/CN2019/082001 dated Jan. 16, 2020.

(Continued)

*Primary Examiner* — Hannah J Pak
(74) *Attorney, Agent, or Firm* — Mary K. Cameron

(57) ABSTRACT

The present invention provides a thermally conductive silicone potting composition. In one embodiment the thermally conductive silicone potting composition comprises:
a first part comprising:
(a) a vinyl organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm,
(f) a catalyst, and
a second part comprising:
(b) a hydride organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm. The present invention also provides a thermal potting adhesive containing the thermally conductive silicone potting composition, a use of the thermally conductive silicone potting composition in an electronic component, and an electronic component, which is potted using the thermally conductive silicone potting composition.

22 Claims, No Drawings

(56) References Cited

FOREIGN PATENT DOCUMENTS

| | | | |
|---|---|---|---|
| CN | 106947428 | A | 7/2017 |
| CN | 108504108 | A | 9/2018 |
| EP | 2182031 | A1 | 5/2010 |
| JP | 2004244491 | A | 9/2004 |
| JP | 2011098566 | A | 5/2011 |
| JP | 5345340 | B2 | 11/2013 |
| JP | 2014224189 | A | 12/2014 |
| JP | 2016084378 | A | 5/2016 |
| JP | 2019011406 | A | 1/2019 |
| TW | 201341472 | A | 10/2013 |
| WO | 2006107004 | A1 | 10/2006 |
| WO | 2012078582 | A1 | 6/2012 |
| WO | 2019021826 | A1 | 1/2019 |

OTHER PUBLICATIONS

Mohammadi et al., Copper Like Thermal Conductivity and Silicon Like Coefficient of Thermal Expansion Copper Graphene for High Power IGBT by Metal Injection Molding, Materials Transactions, vol. 59, No. 11 (2018), pp. 1677-1683.

* cited by examiner

THERMALLY CONDUCTIVE SILICONE POTTING COMPOSITION

TECHNICAL FIELD

The present invention relates to a thermally conductive silicone potting composition. In particular, the present invention relates to a two-part thermally conductive silicone potting composition.

BACKGROUND OF THE INVENTION

With the rapid development of electronic technique, and integrating and assembling technique, electronic components and logic gates, which are closely related to people's life, increasingly tend to be small, and accordingly, such devices generate large amounts of heat. If heat generated in electronic device is high, it will easily bring about fire safety accidents and damage to electronic products. In order to promptly conduct and disperse the heat and prevent vulnerable components from damage such as external light, moisture, dust, radiation and impact, the thermal potting adhesive requires good comprehensive performances including flowability, thermal conductivity and storage stability.

However, the thermal potting adhesives in the prior art show a good thermal conductivity but have unsatisfactory flowability at room temperature. Moreover, the thermal potting adhesives in the prior art have severe filler agglomeration and are very difficult to re-disperse into homogeneous phase.

Therefore, there is a need to develop a thermally conductive silicone potting composition which shows a good balance among flowability, thermal conductivity and storage stability.

SUMMARY OF THE INVENTION

It is an object of the present invention to provide a thermally conductive silicone potting composition which shows a good balance among flowability, thermal conductivity and storage stability.

The present invention provides a thermally conductive silicone potting composition, comprising in one preferred embodiment:
a first part comprising:
(a) a vinyl organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm,
(f) a catalyst, and
a second part comprising:
(b) a hydride organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm.

The present invention also provides a thermal potting adhesive containing the thermally conductive silicone potting composition of the present invention.

Furthermore, the present invention provides a use of the thermally conductive silicone potting composition of the present invention in an electronic component, especially board charger, inverter or converter of automotive.

Moreover, the present invention provides an electronic component, which is potted using the thermally conductive silicone potting composition of the present invention.

The thermally conductive silicone potting composition according to the present invention shows a good balance among flowability, thermal conductivity and storage stability.

DETAILED DESCRIPTION OF THE INVENTION

It is to be understood by one of ordinary skill in the art that the present discussion is a description of exemplary embodiments only and is not intended as limiting the broader aspects of the present invention. Each aspect so described may be combined with any other aspect or aspects unless clearly indicated to the contrary. In particular, any feature indicated as being preferred or advantageous may be combined with any other feature or features indicated as being preferred or advantageous.

Unless specified otherwise, in the context of the present invention, the terms used are to be construed in accordance with the following definitions.

Unless specified otherwise, all wt % values quoted herein are percentages by weight based on total weight of the thermally conductive silicone potting composition.

Unless specified otherwise, as used herein, the singular forms "a", "an" and "the" include both singular and plural referents.

Unless specified otherwise, as used herein, all the average particle diameter values refer to a particle diameter at an integrated value of 50% in a volume-based grain size distribution obtained by a light scattering method using HORIBA LA-950v2 particle size distribution analyser.

Median values are defined as the value where half of the population resides above this point, and half resides below this point. For particle size distributions the median is called the D50. The D50 is the size in microns that splits the distribution with half above and half below this diameter.

The terms "comprising" and "comprises" as used herein are synonymous with "including", "includes" or "containing", "contains", and are inclusive or open-ended and do not exclude additional, non-recited members, elements or process steps.

Unless specified otherwise, the recitation of numerical end points includes all numbers and fractions subsumed within the respective ranges, as well as the recited end points.

Unless otherwise defined, all terms used in the disclosing the invention, including technical and scientific terms, have the meaning as commonly understood by one of the ordinary skill in the art to which this invention belongs.

Typically, a curable, one part (1K) composition is a singular formulation that has sufficient commercial stability to be prepared, stored and shipped to an end user as the singular formulation. The 1K composition can be used without adding any additional components and will cross-link or cure when exposed to suitable conditions. A two part (2K) composition has two or more parts. Each of the parts is prepared, stored and shipped separately from the other part(s). The parts are mixed immediately prior to use. Mixing of the parts starts a cure reaction so commercial storage after mixing is not possible.

According to the present invention, in one preferred embodiment the thermally conductive silicone potting composition comprises:
a first part comprising:
(a) a vinyl organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm,
(f) a catalyst, and
a second part comprising:
(b) a hydride organopolysiloxane,
(c) an alumina filler having an average particle diameter which is greater than or equal to 0.1 μm and less than 3 μm,
(d) an alumina and/or aluminium hydroxide filler having an average particle diameter which is greater than or equal to 3 μm and less than 15 μm,
(e) an alumina filler having an average particle diameter which is greater than or equal to 15 μm and less than or equal to 100 μm.

(a) Vinyl Organopolysiloxane

The thermally conductive silicone potting composition of the present invention comprises a vinyl organopolysiloxane.

The vinyl organopolysiloxane can be any organopolysiloxane used in an addition reaction-curable siloxane resin composition and is not specifically limited. In particular, it is an organopolysiloxane which contains two or more vinyl groups bonded to silicon atoms each molecule. The structure of the organopolysiloxane can be a linear structure containing a diorganopolysiloxane repeating unit in its main chain, a structure containing a branched chain, or a cyclic structure. Among others, the organopolysiloxane of linear structure is preferred.

The groups bonded to silicone atoms except the vinyl group can be any monovalent hydrocarbon group which is unsubstituted or substituted, and do not have an aliphatic unsaturated bond. The monovalent hydrocarbon group can have 1 to 12, preferably 1 to 10, more preferably 1 to 6 carbon atoms. For example, the monovalent hydrocarbon group can be alkyl group, such as methyl, ethyl, propyl, isopropyl, butyl, isobutyl, tert-butyl, pentyl, neo-pentyl, hexyl, heptyl, octyl, nonyl, decyl and dodecyl; cycloalkyl group, such as cyclopentyl, cyclohexyl and cycloheptyl; aryl group, such as phenyl, tolyl, xylyl, naphthyl and biphenyl; and aralkyl group, such as benzyl, phenylethyl, phenylpropyl and methylbenzyl. Among others, unsubstituted or substituted alkyl groups having 1 to 3 carbon atoms and unsubstituted or substituted phenyl groups are preferred; and methyl, ethyl, propyl, chloromethyl, bromoethyl, 3,3,3-trifluoropropyl, cyanoethyl, phenyl, chlorophenyl and fluorophenyl are more preferred. Moreover, the groups bonded to silicone atoms except the vinyl group can be the same, or a combination of two of the above-mentioned groups.

The organopolysiloxane preferably has a dynamic viscosity of 10 mm$^2$/s to 100,000 mm$^2$/s, in particular 500 mm$^2$/s to 50,000 mm$^2$/s at 25° C. If the dynamic viscosity is lower than 10 mm$^2$/s, the storage stability of the curable silicone composition becomes poor. If the dynamic viscosity is higher than 100,000 mm$^2$/s, the viscosity of the curable silicone composition may become too high. The dynamic viscosity can be measured with a Cannon-Fenske viscometer.

For example, the vinyl organopolysiloxane can be at least one organosiloxane A represented by the following general formula (1):

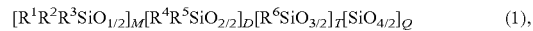

wherein $R^1$, $R^2$, $R^3$, $R^4$, $R^5$ and $R^6$ each independently designates a substituted or unsubstituted monovalent hydrocarbon group or a vinyl group, with the proviso that each molecule comprises at least 2 vinyl groups; and M, D, T and Q each represents a number ranging from 0 to less than 1, provided that M+D+T+Q is 1.

Preferably, the vinyl organopolysiloxane can be at least one organosiloxane A represented by the following general formula (1):

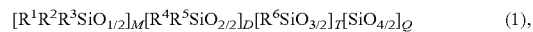

wherein $R^1$, $R^2$, $R^3$, $R^4$, $R^5$ and $R^6$ each independently designates a substituted or unsubstituted alkyl group, a vinyl group, or a substituted or unsubstituted aryl group, with the proviso that each molecule comprises at least 2 vinyl groups; and M, D, T and Q each represents a number ranging from 0 to less than 1, provided that M+D+T+Q is 1.

More preferably, the vinyl organopolysiloxane can be at least one organosiloxane A represented by the following general formula (1):

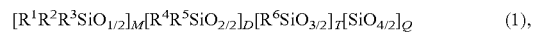

wherein $R^1$, $R^2$, $R^3$, $R^4$, $R^5$ and $R^6$ each independently designates a substituted or unsubstituted alkyl group having 1 to 12, preferably 1 to 10, more preferably 1 to 6 carbon atoms, a vinyl group, or a substituted or unsubstituted aryl group having 6 to 12, preferably 6 to 10 carbon atoms, with the proviso that each molecule comprises at least 2 vinyl groups; and M, D, T and Q each represents a number ranging from 0 to less than 1, provided that M+D+T+Q is 1.

In a preferred embodiment, the vinyl organopolysiloxane can be at least one organosiloxane A represented by the following general formula (1):

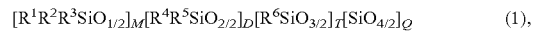

wherein $R^1$, $R^2$, $R^3$, $R^4$, $R^5$ and $R^6$ each independently designates a substituted or unsubstituted methyl group, a vinyl group, or a substituted or unsubstituted phenyl group, with the proviso that each molecule comprises at least 2 vinyl groups; and M, D, T and Q each represents a number ranging from 0 to less than 1, provided that M+D+T+Q is 1.

In a more preferred embodiment, the vinyl organopolysiloxane can be at least one organosiloxane A represented by the following general formula (1):

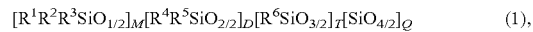

wherein $R^1$, $R^2$, $R^3$, $R^4$, $R^5$ and $R^6$ each independently designates a methyl group, a vinyl group, or a phenyl group, with the proviso that each molecule comprises at least 2 vinyl groups; and M, D, T and Q each represents a number ranging from 0 to less than 1, provided that M+D+T+Q is 1.

In another aspect, in the vinyl organopolysiloxane, preferably, $R^1$, $R^2$, $R^3$, $R^4$, $R^5$ and $R^6$ each independently designates a methyl group or a vinyl group, and/or T=0.

More preferably, $R^1$, $R^2$, $R^3$, $R^4$, $R^5$ and $R^6$ each independently designates a methyl group or a vinyl group, and T=0.

Examples of vinyl organopolysiloxane include, for example, $[Vi(CH_3)_2SiO_{1/2}]_{0.091}[(CH_3)_2SiO_{2/2}]_{0.909}$, $[Vi(CH_3)_2SiO_{1/2}]_{0.060}[(CH_3)_2SiO_{2/2}]_{0.940}$, $[Vi(CH_3)_2SiO_{1/2}]_{0.028}[(CH_3)_2SiO_{2/2}]_{0.972}$, $[Vi(CH_3)_2SiO_{1/2}]_{0.075}[(CH_3)_2SiO_{2/2}]_{0.425}[SiO_{4/2}]_{0.5}$, and $[Vi(CH_3)_2SiO_{1/2}]_{0.19}[(CH_3)_2SiO_{2/2}]_{0.981}$.

Examples of commercially available vinyl organopolysiloxane include, for example, VS 20, VS 50, VS 100, VQM2050 and VS 200, all of which are available from AB Specialty Silicone Company.

In the present invention, the vinyl organopolysiloxane can be a combination of two or more of the above-mentioned vinyl organopolysiloxanes.

The vinyl organopolysiloxane is present in an amount of from 1 wt % to 20 wt %, preferably 2 wt % to 15 wt %, more preferably 3 wt % to 8 wt % based on the total weight of the thermally conductive silicone potting composition. If the content of the vinyl organopolysiloxane is less than 1 wt %, too less polymer will lead to too higher viscosity. If the content of the vinyl organopolysiloxane is more than 20 wt %, too much polymer will lower down thermal conductivity.

(b) Hydride Organopolysiloxane

The thermally conductive silicone potting composition of the present invention comprises a hydride organopolysiloxane.

The hydride organopolysiloxane is a crosslinker which contains at least two, preferably three or more than three hydrogen atoms bonded to silicon atom each molecule. The structure of the hydride organopolysiloxane can be straight chain, branched or cyclic. The hydride organopolysiloxane preferably has a viscosity of 1 mPa·s to 5,000 mPa·s, more preferably 5 mPa·s to 500 mPa·s at 25° C. The viscosity can be measured with rotational viscometer of BM type. The hydride organopolysiloxane can be any well-known hydride organopolysiloxane.

The groups bonded to silicone atoms except hydrogen can be any monovalent hydrocarbon group which is unsubstituted or substituted. The monovalent hydrocarbon group can have 1 to 12, preferably 1 to 10, more preferably 1 to 6 carbon atoms. For example, the monovalent hydrocarbon group can be alkyl group, such as methyl, ethyl, propyl, isopropyl, butyl, isobutyl, tert-butyl, pentyl, neo-pentyl, hexyl, heptyl, octyl, nonyl, decyl and dodecyl; alkenyl group, such as vinyl, propenyl, butenyl, and pentenyl; cycloalkyl group, such as cyclopentyl, cyclohexyl and cycloheptyl; aryl group, such as phenyl, tolyl, xylyl, naphthyl and biphenyl; and aralkyl group, such as benzyl, phenylethyl, phenylpropyl and methylbenzyl. Among others, unsubstituted or substituted alkyl groups having 1 to 3 carbon atoms, unsubstituted or substituted alkenyl groups having 2 to 3 carbon atoms, and unsubstituted or substituted phenyl groups are preferred; and methyl, ethyl, propyl, chloromethyl, bromoethyl, 3,3,3-trifluoropropyl, cyanoethyl, vinyl, phenyl, chlorophenyl and fluorophenyl are more preferred. Moreover, the groups bonded to silicone atoms except the hydrogen can be the same, or a combination of two of the above-mentioned groups.

For example, the hydride organopolysiloxane can be at least one organopolysiloxane B represented by the following general formula (2):

$$[R^7R^8R^9SiO_{1/2}]_{M'}[R^{10}R^{11}SiO_{2/2}]_{D'}[R^{12}SiO_{3/2}]_{T'}[SiO_{4/2}]_{Q'} \qquad (2),$$

wherein $R^7$, $R^8$, $R^9$, $R^{10}$, $R^{11}$ and $R^{12}$ each independently designates a substituted or unsubstituted monovalent hydrocarbon group, or hydrogen, with the proviso that each molecule comprises at least 2 hydrogen atoms directly bonded to silicon; and M', D', T' and Q' each represents a number ranging from 0 to less than 1, provided that M'+D'+T'+Q' is 1.

Preferably, the hydride organopolysiloxane can be at least one organopolysiloxane B represented by the following general formula (2):

$$[R^7R^8R^9SiO_{1/2}]_{M'}[R^{10}R^{11}SiO_{2/2}]_{D'}[R^{12}SiO_{3/2}]_{T'}[SiO_{4/2}]_{Q'} \qquad (2),$$

wherein $R^7$, $R^8$, $R^9$, $R^{10}$, $R^{11}$ and $R^{12}$ each independently designates a substituted or unsubstituted alkyl group, a substituted or unsubstituted alkenyl group, a substituted or unsubstituted aryl group, or hydrogen, with the proviso that each molecule comprises at least 2 hydrogen atoms directly bonded to silicon; and M', D', T' and Q' each represents a number ranging from 0 to less than 1, provided that M'+D'+T'+Q' is 1.

More preferably, the hydride organopolysiloxane can be at least one organopolysiloxane B represented by the following general formula (2):

$$[R^7R^8R^9SiO_{1/2}]_{M'}[R^{10}R^{11}SiO_{2/2}]_{D'}[R^{12}SiO_{3/2}]_{T'}[SiO_{4/2}]_{Q'} \qquad (2),$$

wherein $R^7$, $R^8$, $R^9$, $R^{19}$, $R^{11}$ and $R^{12}$ each independently designates a substituted or unsubstituted alkyl group having 1 to 12, preferably 1 to 10, more preferably 1 to 6 carbon atoms, a substituted or unsubstituted alkenyl group having 2 to 12, preferably 2 to 10, more preferably 2 to 6 carbon atoms, a substituted or unsubstituted aryl group having 6 to 12, preferably 6 to 10, more preferably 6 carbon atoms, or hydrogen, with the proviso that each molecule comprises at least 2 hydrogen atoms directly bonded to silicon; and M', D', T' and Q' each represents a number ranging from 0 to less than 1, provided that M'+D'+T'+Q' is 1.

In a preferred embodiment, the hydride organopolysiloxane can be at least one organopolysiloxane B represented by the following general formula (2):

$$[R^7R^8R^9SiO_{1/2}]_{M'}[R^{10}R^{11}SiO_{2/2}]_{D'}[R^{12}SiO_{3/2}]_{T'}[SiO_{4/2}]_{Q'} \qquad (2),$$

wherein $R^7$, $R^8$, $R^9$, $R^{10}$, $R^{11}$ and $R^{12}$ each independently designates a substituted or unsubstituted methyl group, a substituted or unsubstituted ethyl group, a substituted or unsubstituted vinyl group, a substituted or unsubstituted phenyl group, or hydrogen, with the proviso that each molecule comprises at least 2 hydrogen atoms directly bonded to silicon; and M', D', T' and Q' each represents a number ranging from 0 to less than 1, provided that M'+D'+T'+Q' is 1.

In a more preferred embodiment, the hydride organopolysiloxane can be at least one organopolysiloxane B represented by the following general formula (2):

$$[R^7R^8R^9SiO_{1/2}]_{M'}[R^{10}R^{11}SiO_{2/2}]_{D'}[R^{12}SiO_{3/2}]_{T'}[SiO_{4/2}]_{Q'} \qquad (2),$$

wherein $R^7$, $R^8$, $R^9$, $R^{10}$, $R^{11}$ and $R^{12}$ each independently designates a methyl group, an ethyl group, a vinyl group, a phenyl group, or hydrogen, with the proviso that each molecule comprises at least 2 hydrogen atoms directly bonded to silicon; and M', D', T' and Q' each represents a number ranging from 0 to less than 1, provided that M'+D'+T'+Q' is 1.

In another aspect, in the hydride organopolysiloxane, preferably, $R^7$, $R^8$, $R^9$, $R^{10}$, $R^{11}$ and $R^{12}$ each independently designate a methyl group and/or hydrogen. In a further aspect, in the hydride organopolysiloxane, preferably, T'=0 and Q'=0. More preferably, $R^7$, $R^8$, $R^9$, $R^{10}$, $R^{11}$ and $R^{12}$ each independently designate a methyl group and/or hydrogen, T'=0, and Q'=0.

Examples of hydride organopolysiloxane include, for example, $[H(CH_3)_2SiO_{1/2}]_{0.117}[(CH_3)_2SiO_{2/2}]_{0.883}$, $[(CH_3)_3SiO_{1/2}]_{0.017}[H(CH_3)SiO_{2/2}]_{0.069}[(CH_3)_2SiO_{2/2}]_{0.914}$, and $[H(CH_3)_2SiO_{1/2}]_{0.12}[(CH_3)_2SiO_{2/2}]_{0.988}$. More preferably, the hydride organopolysiloxane is a combination of $[(CH_3)_3SiO_{1/2}]_{0.017}[H(CH_3)SiO_{2/2}]_{0.069}[(CH_3)_2SiO_{2/2}]_{0.914}$ and $[H(CH_3)_2SiO_{1/2}]_{0.012}[(CH_3)_2SiO_{2/2}]_{0.988}$, or a combination of $[H(CH_3)_2SiO_{1/2}]_{0.117}[(CH_3)_2SiO_{2/2}]_{0.883}$, $[(CH_3)_3SiO_{1/2}]_{0.017}[H(CH_3)SiO_{2/2}]_{0.069}[(CH_3)_2SiO_{2/2}]_{0.914}$ and $[H(CH_3)_2SiO_{1/2}]_{0.012}[(CH_3)_2SiO_{2/2}]_{0.988}$.

Examples of commercially available hydride organopolysiloxane include, for example, CE 13, XL1B, and CE500, all of which are available from AB Specialty Silicone Company. More preferably, the hydride organopolysiloxane is a combination of XL1B and CE500, or a combination of CE 13, XL1B and CE500.

In the present invention, the hydride organopolysiloxane can be a combination of two or more of the above-mentioned hydride organopolysiloxanes. Preferably, the hydride organopolysiloxane is a combination of two or three of the above-mentioned hydride organopolysiloxanes.

The hydride organopolysiloxane is present in an amount of from 1 wt % to 20 wt %, preferably 2 wt % to 15 wt %, more preferably 3 wt % to 10 wt % based on the total weight of the thermally conductive silicone potting composition. If the content of the hydride organopolysiloxane is less than 1 wt %, too less polymer will lead to too higher viscosity. If the content of the hydride organopolysiloxane is more than 20 wt %, too much polymer will low down thermal conductivity.

In the present invention, the weight ratio of component (a) to component (b) is preferably in the range of 10:1 to 1:10, more preferably in the range of 5:1 to 1:5, in particular in the range of 3:1 to 1:3, and specifically in the range of 2:1 to 1:3.

Alumina and/or Aluminium Hydroxide Fillers (c) Alumina filler having an average particle diameter which is greater than or equal to 0.1 μm and less than 3 μm (d) Alumina and/or aluminium hydroxide filler having an average particle diameter which is greater than or equal to 3 μm and less than 15 μm (e) Alumina filler having an average particle diameter which is greater than or equal to 15 μm and less than or equal to 100 μm According to the present invention, the thermally conductive silicone potting composition comprises an alumina filler having an average particle diameter which is greater than or equal to 0.1 μm and less than 3 μm, an alumina and/or aluminium hydroxide filler having an average particle diameter which is greater than or equal to 3 μm and less than 15 μm, and an alumina filler having an average particle diameter which is greater than or equal to 15 μm and less than or equal to 100 μm.

In the present invention, there are no particular restrictions on the shape of the alumina and/or aluminium hydroxide fillers. The shape of the alumina and/or aluminium hydroxide fillers of the present invention may be a regular or irregular shape and includes but is not limited to polygon, cube, oval, sphere, needle, flake, plate or any combination thereof. Preferably, the alumina and/or aluminium hydroxide fillers are in a spherical shape and/or non-spherical shape.

The total content of the components (c), (d) and (e) is greater than 80 wt % and less than 98 wt %, preferably greater than 85 wt % and less than 91 wt %, based on the total weight of the thermally conductive silicone potting composition. If the total content of the components (c), (d) and (e) is less than 80 wt %, too less filler loading will lead to too low thermal conductivity. If the total content of the components (c), (d) and (e) is higher than 98 wt %, too high filler loading will lead to too high viscosity.

The average particle diameter of the component (c) is preferably in the range of from 0.2 μm to 2.5 μm, and more preferably 0.5 μm to 2 μm.

Examples of commercially available component (c) include, for example, AX1M, which is a spherical alumina having a D50=0.7 μm available from NIPPON STEEL Chemical & Material Co., Ltd.; NASR-05, which is a non-spherical alumina having a D50=0.5 μm available from Bestry Performance Materials Co., Ltd.; and DAW-01, which is a spherical alumina having a D50=2 μm available from Denka Corporation.

The component (c) is present in a total amount of from 4 wt % to 65 wt %, preferably 8 wt % to 50 wt % based on the total weight of the thermally conductive silicone potting composition.

The weight ratio of component (c) in the first part to component (c) in the second part is 1:10 to 10:1, preferably 2:8 to 8:2, more preferably 4:6 to 6:4, most preferably 5:5 to 5:5.

The average particle diameter of the component (d) is preferably in the range of from 4 μm to 12 μm, and more preferably 5 μm to 10 μm.

Preferably, the component (d) is an alumina filler having an average particle diameter which is greater than or equal to 3 μm and less than 15 μm.

Examples of commercially available component (d) include, for example, BAK 10, which is a spherical alumina having a D50=10 μm available from Bestry Performance Materials Co., Ltd.; BA 7, which is a non-spherical alumina having a D50=7 μm available from Bestry Performance Materials Co., Ltd.; BAK 5, which is a spherical alumina having a D50=5 μm available from Bestry Performance Materials Co., Ltd.; and Martinal® ON-908, which is a non-spherical aluminium hydroxide filler having a D50=8 μm available from Huber Fire Retardant Additives (Qingdao) Co., Ltd.

The component (d) is present in a total amount of from 3 wt % to 45 wt %, preferably 4 wt % to 35 wt % based on the total weight of the thermally conductive silicone potting composition.

The weight ratio of component (d) in the first part to component (d) in the second part is 1:10 to 10:1, preferably 2:8 to 8:2, more preferably 4:6 to 6:4, most preferably 5:5 to 5:5.

The average particle diameter of the component (e) is preferably in the range of from 20 μm to 90 μm, and more preferably 20 μm to 70 μm.

Examples of commercially available component (e) include, for example, BAK 70, which is a spherical alumina having a D50=70 μm available from Bestry Performance Materials Co., Ltd.; YR 40, which is a non-spherical alumina having a D50=40 μm available from Shanghai Yurui New Material Co., Ltd.; BAK 30, which is a spherical alumina having a D50=30 μm available from Bestry Performance Materials Co., Ltd.; and DAW20, which is a spherical alumina having a D50=20 μm available from Denka Corporation.

The component (e) is present in a total amount of from 25 wt % to 70 wt %, preferably 30 wt % to 65 wt % based on the total weight of the thermally conductive silicone potting composition.

The weight ratio of component (e) in the first part to component (e) in the second part is 1:10 to 10:1, preferably 2:8 to 8:2, more preferably 4:6 to 6:4, most preferably 5:5 to 5:5.

In an embodiment of the present invention, the total weight ratio of component (c) to component (d) is preferably in the range of 10:1 to 1:10, more preferably in the range of 5:1 to 1:5, and in particular in the range of 5:1 to 1:3. In an embodiment of the present invention, the total weight ratio of component (c) to component (e) is preferably in the range of 10:1 to 1:15, more preferably in the range of 5:1 to 1:10, and in particular in the range of 5:3 to 1:8. In an embodiment of the present invention, the total weight ratio of component (d) to component (e) is preferably in the range of 1:20 to 5:1, more preferably in the range of 1:15 to 1:1, and in particular in the range of 1:12 to 0.6:1.

(f) Catalyst

According to the present invention, the thermally conductive silicone potting composition comprises a catalyst.

The catalyst of the present invention may be any catalyst used to facilitate the addition reaction of the aforementioned components. As such catalyst, there may be used a known catalyst for use in addition reaction. The catalyst that may be employed in the present invention include, but are not limited to catalysts comprising rhodium, platinum, palladium, nickel, rhenium, ruthenium, osmium, copper, cobalt, iron and combinations thereof. Preferably, the catalyst of the present invention is catalysts comprising platinum. For example, there may be used elemental platinum, platinum black, chloroplatinic acid, a platinum-olefin complex, a platinum-alcohol complex and a platinum coordination compound. In the present invention, not only one kind, but two or more kinds of such catalyst comprising platinum can be used in combination.

Examples of commercially available catalyst include, for example, SIP 6832.2, which is 2% Pt in cyclomethylvinylsiloxanes available from Gelest Company.

The amount of catalyst present in the present thermally conductive silicone potting composition ranges from 1 to 1000 ppm platinum by weight of the total thermally conductive silicone potting composition, preferably from 5 to 800 ppm platinum by weight of the total thermally conductive silicone potting composition, more preferably 10 to 500 ppm platinum by weight of the total thermally conductive silicone potting composition, and most preferably from 100 to 350 platinum by weight of the total thermally conductive silicone potting composition.

(g) Silane Coupling Agent or Titanium-Based Coupling Agent

According to the present invention, preferably, the thermally conductive silicone potting composition further comprises (g) a silane coupling agent or titanium-based coupling agent.

The component (g) useful in the invention includes, but is not limited to aminoalkyl silanes, methacryloxy silanes, acryloxy silanes, alkoxy silanes, epoxy silanes, mercaptoalkyl silanes and combinations thereof. The component (g) must not deactivate the catalyst employed in the inventive thermally conductive silicone potting composition. Preferably, the component (g) is a silane coupling agent. More preferably, the component (g) is $C_6$-$C_{16}$ silane coupling agent.

In another aspect, the component (g) is preferably an alkoxy silane. More preferably, the component (g) is hexyltrimethoxysilane or hexadecyltrimethoxysilane. Examples of commercially available component (g) include, but are not limited to, hexyltrimethoxysilane (CAS number 3069-19-0) and hexadecyltrimethoxysilane (CAS number 16415-12-6), both of which are available from J&K Scientific Company.

The component (g) can be present in the first part and/or the second part of the thermally conductive silicone potting composition. If the component (g) is present in both the first part and the second part, the weight ratio of the component (g) in the first part to the component (g) in the second part is not limited.

The amount of the component (g) present in the inventive thermally conductive silicone potting composition ranges from 0.001 to 5 wt %, preferably from 0.01 to 1 wt %, more preferably from 0.05 to 0.5 wt %, and most preferably from 0.08 to 0.2 wt %.

Optional Components

The thermally conductive silicone potting composition according to the present invention may be formulated to contain one or more additional components or additives besides those described above. For example, the thermally conductive silicone potting composition may additionally comprise at least one of: catalyst inhibitor, nonreactive organo(poly) siloxane such as a methylpolysiloxane, a known antioxidant such as 2,6-di-t-butyl-4-methylphenol, a dye, a pigment, a flame retardant, an antisettling agent or a thixotropy improver. Preferably, the inventive thermally conductive silicone potting composition may additionally comprise a catalyst inhibitor.

Catalyst inhibitors useful in the practice of the present invention include, but are not limited to maleates, alkynes, phosphites, alkynols, fumarates, succinates, cyanurates, isocyanurates, alkynylsilanes, vinyl containing siloxanes and combinations thereof. Catalyst inhibitors such as esters of maleic acid (e.g. diallylmaleate, dimethylmaleate), acetylenic alcohols (e.g., 3,5-dimethyl-1-hexyn-3-ol and 2-methyl-3-butyn-2-ol), amines, and tetravinyltetramethylcyclotetrasiloxane and mixtures thereof can also be employed. Preferably, the catalyst inhibitor of the present invention is acetylenic alcohols; and more preferably, the catalyst inhibitor is 3,5-dimethyl-1-hexyn-3-ol (CAS number 107-54-0), which is commercially available from J&K Scientific Company. The catalyst inhibitor can be present in the first part and/or the second part of the thermally conductive silicone potting composition. If the catalyst inhibitor is present in both the first part and the second part, the weight ratio of the catalyst inhibitor in the first part to the catalyst inhibitor in the second part is not limited.

The amount of the catalyst inhibitor present in the inventive thermally conductive silicone potting composition ranges from 0.001 to 1 wt %, preferably from 0.002 to 0.6 wt %, more preferably from 0.005 to 0.4 wt %, and most preferably from 0.006 to 0.2 wt %.

Steps for Producing Thermally Conductive Silicone Potting Composition

The thermally conductive silicone potting composition according to the present invention can be made by any appropriate method. For example, the composition can be made by simply mixing all the components of a first part together, and simply mixing all the components of a second part together.

In fact, there are no particular restrictions on the production methods of the thermally conductive silicone potting composition of the present invention, as long as the method complies with a conventional method for producing a two-part thermally conductive silicone potting composition. For example, the thermally conductive silicone potting composition can be produced by a method comprising a step of mixing together the components (a), (c), (d), (e), (f) and other components if needed, and a step of mixing together the components (b), (c), (d), (e) and other components if needed, in which all the mixing may be carried out by means of Tri-Mix, Twin-Mix, Planetary Mixer (all are registered trademarks of mixers by Inoue Mfg., Inc); Ultra Mixer (registered trademark of mixer by Mizuho Industrial Co., Ltd); Hivis Disper Mix (registered trademark of mixer by PRIMIX Corporation) and the like. The mixer used in the present invention may be a planetary mixer manufactured by PC Laborsystem Co., Ltd.

The thermally conductive silicone potting composition according to the present invention shows a good balance among flowability, thermal conductivity and storage stability.

The thermally conductive silicone potting composition of the present invention shows a good flowability. Preferably, the viscosity of the thermally conductive silicone potting composition according to the present invention is in the range of 3 to 20 Pa·s, more preferably 4 to 19 Pa·s when measured at 25° C. The viscosity used herein refers to a value measured using a viscometer with PP25 cone plate (product name: MCR301, manufactured by Anton Paar Co., Ltd.) at a speed of 10 s$^{-1}$ at 25° C.

The thermally conductive silicone potting composition of the present invention has a high thermal conductivity. Preferably, the thermal conductivity of the thermally conductive silicone potting composition according to the present invention is higher than 1.2 W/m·k, more preferably higher than 1.7 W/m·k. As used herein, the thermal conductivity is measured by the known pulse heating method using a xenon flash analyzer "LFA-447" (manufactured by NETZSCH Group).

The thermally conductive silicone potting composition of the present invention shows a good stable stability. Preferably, the thermally conductive silicone potting composition of the present invention does not include hard agglomeration after storing three months, even four or five months, at 25° C.

The present invention also provides a thermal potting adhesive containing the thermally conductive silicone potting composition of the present invention.

Furthermore, the present invention provides a use of the thermally conductive silicone potting composition of the present invention in an electronic component, especially board charger, inverter or converter of automotive.

Moreover, the present invention provides an electronic component, which is potted using the thermally conductive silicone potting composition of the present invention.

The following examples are intended to assist one skilled in the art to better understand and practice the present invention. The scope of the invention is not limited by the examples but is defined in the appended claims. All parts and percentages are based on weight unless otherwise stated.

Examples

The following raw materials were used in the examples.
Component (a)
(a-1): VS 20, vinyl terminated polydimethylsiloxane with a structure of $[Vi(CH_3)_2SiO_{1/2}]_{0.91}[(CH_3)_2SiO_{2/2}]_{0.909}$, was manufactured by AB Specialty Silicone Company.
(a-2): VS 50, vinyl terminated polydimethylsiloxane with a structure of $[Vi(CH_3)_2SiO_{1/2}]_{0.60}[(CH_3)_2SiO_{2/2}]_{0.940}$, was manufactured by AB Specialty Silicone Company.
(a-3): VS 100, vinyl terminated polydimethylsiloxane with a structure of $[Vi(CH_3)_2SiO_{1/2}]_{0.028}[(CH_3)_2SiO_{2/2}]_{0.972}$, was manufactured by AB Specialty Silicone Company.
(a-4): VQM2050, vinyl containing polysiloxane with a structure of $[Vi(CH_3)_2SiO_{1/2}]_{0.075}[(CH_3)_2SiO_{2/2}]_{0.425}[SiO_{4/2}]_{0.5}$, was manufactured by AB Specialty Silicone Company.
(a-5): VS 200, vinyl terminated polydimethylsiloxane with a structure of $[Vi(CH_3)_2SiO_{1/2}]_{0.019}[(CH_3)_2SiO_{2/2}]_{0.981}$, was manufactured by AB Specialty Silicone Company.
Component (b)
(b-1): CE 13, silicon-hydride terminated polydimethylsiloxane with a structure of $[H(CH_3)_2SiO_{1/2}]_{0.117}[(CH_3)_2SiO_{2/2}]_{0.883}$, was manufactured by AB Specialty Silicone Company.
(b-2): XL1B, silicon-hydride containing polysiloxanes with a structure of $[(CH_3)_3SiO_{1/2}]_{0.017}[H(CH_3)SiO_{2/2}]_{0.069}[(CH_3)_2SiO_{2/2}]_{0.914}$, was manufactured by AB Specialty Silicone Company.
(b-3): CE500, silicon-hydride terminated polydimethylsiloxane with a structure of $[H(CH_3)_2SiO_{1/2}]_{0.012}[(CH_3)_2SiO_{2/2}]_{0.988}$, was manufactured by AB Specialty Silicone Company.
Component (c)
(c-1): AX1M, spherical alumina (D50=0.7 μm), was manufactured by NIPPON STEEL Chemical & Material Co., Ltd.
(c-2): NASR-05, non-spherical alumina (D50=0.5 μm), was manufactured by Bestry Performance Materials Co., Ltd.
(c-3): DAW-01, spherical alumina (D50=2 μm), was manufactured by Denka Corporation.
Component (d)
(d-1): BAK 10, spherical alumina (D50=10 μm), was manufactured by Bestry Performance Materials Co., Ltd.
(d-2): BA 7, non-spherical alumina (D50=7 μm), was manufactured by Bestry Performance Materials Co., Ltd.
(d-3): BAK 5, spherical alumina (D50=5 μm), was manufactured by Bestry Performance Materials Co., Ltd.
(d-4): Martinal® ON-908, which is a non-spherical aluminum hydroxide filler having a D50=8 μm available from Huber Fire Retardant Additives (Qingdao) Co., Ltd.
Component (e)
(e-1): BAK 70, spherical alumina (D50=70 μm), was manufactured by Bestry Performance Materials Co., Ltd.
(e-2): SJR 20, crystalline silica (D50=20 μm), was manufactured by AnHui Estone Materials Technology Co., Ltd.
(e-3): YR 40, nonspherical alumina (D50=40 μm), was manufactured Shanghai Yurui New Material Co., Ltd.
(e-4): BAK 30, spherical alumina (D50=30 μm), was manufactured by Bestry Performance Materials Co., Ltd.
(e-5): DAW 20, spherical alumina (D50=20 μm), was manufactured by Denka Corporation.
Component (f)
(f-1): SIP 6832.2, 2% Pt in cyclomethylvinylsiloxanes, was manufactured by Gelest Company.
Component (g)
(g-1): Hexyltrimethoxysilane, CAS number 3069-19-0, was manufactured by J&K Scientific Company.
(g-2): Hexadecyltrimethoxysilane, CAS number 16415-12-6, was manufactured by J&K Scientific Company.
Component (h)
(h-1): 3,5-dimethyl-1-hexyn-3-ol, CAS number 107-54-0, was manufactured by J&K Scientific Company.

Preparation of Silicone Composition
First Part:

The component (a), half of the component (c), half of the component (d), half of the component (e), component (f), component (h) and half of the component (g), if present, were mixed together in the weight parts shown below, thereby forming a first part of compositions of inventive examples 1 to 11, and comparative examples 1 to 4. In other words, the components (a), half of the component (c), half of the component (d), half of the component (e), component (f), component (h), and half of the component (g), if present, were combined in a 2-liter planetary mixer (manufactured by PC Laborsystem Co., Ltd.) using the ratios (parts by weight) shown in Tables 1, 2 and 3, and in each case the resulting mixture was mixed for two hours at 25° C. The mixture was then cooled to room temperature.

Second Part:

The component (b), half of the component (c), half of the component (d), half of the component (e), and half of the component (g), if present, were mixed together in the weight parts shown below, thereby forming a second part of compositions of inventive examples 1 to 11, and comparative examples 1 to 4. In other words, the components (b), half of the component (c), half of the component (d), half of the component (e), and half of the component (g), if present, were combined in a 2-liter planetary mixer (manufactured by PC Laborsystem Co., Ltd.) using the ratios (parts by weight) shown in Tables 1, 2 and 3, and in each case the resulting mixture was mixed for two hours at 25° C. The mixture was then cooled to room temperature.

The compositions thus obtained wherein the first part and the second part were stored separately were evaluated for viscosity, thermal conductivity and storage stability in accordance with the methods below. The results thereof are shown in Tables 1, 2 and 3.

[Measurement of Viscosity]

The first part and the second part of the prepared composition were mixed for 2 minutes under 2000 rpm. After that, the viscosity was then measured at a speed of $10\ S^{-1}$ at 25° C. using a viscometer with PP25 cone plate (product name: MCR301, manufactured by Anton Paar Co., Ltd.).

[Measurement of Thermal Conductivity Tc]

The first part and the second part of the prepared composition were mixed for 2 minutes under 2000 rpm. After that, the obtained mixture was cured at 80° C. for 2 hours. The cured samples were cut into round pieces with 2 mm thickness and 12.7 mm diameter.

The thermal conductivity was measured by the pulse heating method using a xenon flash analyzer "LFA-447" (manufactured by NETZSCH Group).

[Measurement of Storage Stability]

The prepared compositions wherein the first part and the second part were stored separately were stored in a constant-temperature chamber at 25° C., and were checked every month. If we found hard agglomeration at the bottom, take out the sample, and record the time with good storage condition. As for a composition, the shorter in the record time of the first part and the record time of the second part is recorded as the record time of the composition.

If the record time is 1 month, the storage stability of the composition is poor. If the record time is 2 month, the storage stability of the composition is middle. If the record time is 3 month, the storage stability of the composition is excellent.

TABLE 1

| | | Inventive Example | | | | | |
|---|---|---|---|---|---|---|---|
| | | 1 | 2 | 3 | 4 | 5 | 6 |
| Composition (part by weight) | (a-1) | | | | | 4.44 | 4.44 |
| | (a-2) | | | | | | |
| | (a-3) | 5.35 | 5.95 | 4.58 | | | |
| | (a-4) | | | | 1.50 | | |
| | (a-5) | | | | 1.50 | 1.33 | 1.33 |
| | (b-1) | | | | | 2.98 | 2.98 |
| | (b-2) | 1.24 | 2.00 | 1.07 | 1.30 | 1.15 | 1.15 |
| | (b-3) | 7.38 | 4.02 | 6.32 | 7.67 | 0.10 | 0.10 |
| | (c-1) | 10.00 | 20.00 | 20.00 | 20.00 | | |
| | (c-2) | | | | | | 10.00 |
| | (c-3) | | | | | 8.10 | |
| | (d-1) | | | | | 18.90 | 30.00 |
| | (d-2) | | | | | | |
| | (d-3) | 16.00 | 18.00 | 18.00 | 18.00 | | |
| | (d-4) | | | | | | |
| | (e-1) | | | | | | 49.98 |
| | (e-2) | | | | | | |
| | (e-3) | | | | | | |
| | (e-4) | | | | | 62.98 | |
| | (e-5) | 60.00 | 49.99 | 49.99 | 49.99 | | |
| | (f-1) | 0.014 | 0.014 | 0.014 | 0.014 | 0.015 | 0.015 |
| | (g-1) | | | | | | |
| | (g-2) | | | | | | |
| | (h-1) | 0.007 | 0.014 | 0.014 | 0.014 | 0.015 | 0.015 |
| Evaluation result | Viscosity (Pa·s) | 13 | 16.9 | 17.4 | 19 | 15.8 | 16 |
| | Tc (W/m·k) | 1.7 | 2 | 2 | 1.9 | 2.4 | 2.7 |
| | Storage stability (month) | 3 | 3 | 3 | 3 | 3 | 3 |

TABLE 2

| | | Inventive Example | | | | |
|---|---|---|---|---|---|---|
| | | 7 | 8 | 9 | 10 | 11 |
| (Composition (part by weight) | (a-1) | 4.44 | 4.44 | 4.44 | 4.44 | 4.44 |
| | (a-2) | | | | | |
| | (a-3) | | | | | |
| | (a-4) | | | | | |
| | (a-5) | 1.33 | 1.33 | 1.33 | 1.33 | 1.33 |
| | (b-1) | 2.98 | 2.98 | 2.98 | 2.98 | 2.98 |
| | (b-2) | 1.15 | 1.15 | 1.15 | 1.15 | 1.15 |
| | (b-3) | 0.10 | 0.10 | 0.10 | 0.10 | 0.10 |
| | (c-1) | | | | | |
| | (c-2) | | | | | |
| | (c-3) | 25.00 | 49.98 | 8.10 | 8.10 | 18.90 |
| | (d-1) | | 10.00 | 18.90 | 18.90 | |
| | (d-2) | 5.00 | | | | |
| | (d-3) | | | | | |
| | (d-4) | | | | | 8.10 |
| | (e-1) | | | | | |
| | (e-2) | | | | | |
| | (e-3) | 29.98 | | | | |
| | (e-4) | 30.00 | 30.00 | 62.88 | 62.88 | 62.88 |
| | (e-5) | | | | | |
| | (f-1) | 0.015 | 0.015 | 0.015 | 0.015 | 0.015 |
| | (g-1) | | | 0.1 | | |
| | (g-2) | | | | 0.1 | |
| | (h-1) | 0.015 | 0.015 | 0.015 | 0.015 | 0.015 |
| Evaluation result | Viscosity (Pa · s) | 16 | 19 | 16.5 | 18 | 8 |
| | Tc (W/m · k) | 2 | 2.3 | 2.4 | 2.4 | 2.2 |
| | Storage stability (month) | 3 | 3 | 4 | 5 | 3 |

TABLE 3

| | | Comparative Example | | | |
|---|---|---|---|---|---|
| | | 1 | 2 | 3 | 4 |
| Composition (part by weight) | (a-1) | 4.44 | 4.44 | 4.44 | |
| | (a-2) | | | | |
| | (a-3) | | | | 5.35 |
| | (a-4) | | | | |
| | (a-5) | 1.33 | 1.33 | 1.33 | |
| | (b-1) | 2.98 | 2.98 | 2.98 | |
| | (b-2) | 1.15 | 1.15 | 1.15 | 1.24 |
| | (b-3) | 0.10 | 0.10 | 0.10 | 7.38 |
| | (c-1) | | | | 10.00 |
| | (c-2) | 40.00 | | 29.98 | |
| | (c-3) | | | | |
| | (d-1) | | 60.00 | | |
| | (d-2) | | | | |
| | (d-3) | 34.98 | | 16.00 | |
| | (e-1) | | | | |
| | (e-2) | | | 60.00 | |
| | (e-3) | | | | |
| | (e-4) | 49.98 | 55.00 | | |
| | (e-5) | | | | |
| | (f-1) | 0.015 | 0.015 | 0.015 | 0.014 |
| | (g-1) | | | | |
| | (g-2) | | | | |
| | (h-1) | 0.015 | 0.015 | 0.015 | 0.007 |
| Evaluation result | Viscosity (Pa.s) | 50 | 15 | 60 | 30 |
| | Tc (W/m.k) | 2.20 | 2.20 | 2 | 1.1 |
| | Storage stability (month) | 3 | 1 | 3 | 3 |

As shown in Tables 1, 2 and 3, it is obvious that the thermally conductive silicone potting compositions of inventive examples 1 to 11, which comprised a combination of components (a) to (f) and (h), especially the combination of components (c) to (e), according to the present invention exhibited a better balance among flowability, thermal conductivity and storage stability than those of comparative examples 1 to 4. In particular, it can be seen that the thermally conductive silicone potting compositions of inventive examples 9 and 10 (which comprised component (g) according to the present invention) exhibited a storage stability of 4 month or 5 month, which was better than the thermally conductive silicone potting compositions of inventive examples 1 to 8 (which did not comprise component (g) according to the present invention).

Meanwhile, as compared with the compositions of inventive examples 5 to 8, the composition of comparative example 1, which did not comprise component (d) according to the present invention, had a viscosity of 50 Pa·s, which indicated that the flowability of the composition was poor.

Further, as compared with the compositions of inventive examples 5 to 8, the composition of comparative example 2, which did not comprise component (c) according to the present invention, had a storage stability of 1 month, which indicated that the storage stability of the composition was poor.

Furthermore, as compared with the compositions of inventive examples 5 to 8, the composition of comparative example 3, which did not comprise component (e) according to the present invention, had a viscosity of 60 Pa·s, which indicated that the flowability of the composition was poor.

Furthermore, as compared with the composition of inventive example 1, the composition of comparative example 4, which comprised crystalline silica instead of component (e) according to the present invention, had a viscosity of 30 Pa·s, which indicated that the flowability of the composition was poor, and a thermal conductivity of 1.1 W/m·k, which indicated that the thermal conductivity of the composition was poor.

To sum up, the thermally conductive silicone potting composition according to the present invention exhibits a good balance among flowability, thermal conductivity and storage stability.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A thermally conductive silicone potting composition including a first part and a second part;
   the first part comprising:
   (a) a vinyl organopolysiloxane,
   (c) an alumina filler having an average particle diameter which is greater than or equal to 0.1 μm and less than 3 μm,
   (d) an alumina and/or aluminum hydroxide filler having an average particle diameter which is greater than or equal to 3 μm and less than 15 μm,
   (e) an alumina filler having an average particle diameter which is greater than or equal to 15 μm and less than or equal to 100 μm,
   (f) a catalyst, and
   the second part comprising:
   (b) a hydride organopolysiloxane,
   (c) an alumina filler having an average particle diameter which is greater than or equal to 0.1 μm and less than 3 μm, (d) an alumina and/or aluminum hydroxide filler having an average particle diameter which is greater than or equal to 3 μm and less than 15 μm, and (e) an alumina filler having an average particle diameter which is greater than or equal to 15 μm and less than or equal to 100 μm, wherein the component (a) is at least one organosiloxane A represented by the following general formula (1):

$[R^1R^2R^3SiO_{1/2}]_M[R^4R^5SiO_{2/2}]_D[R^6SiO_{3/2}]_T[SiO_{4/2}]_Q$     (1), wherein $R^1$, $R^2$, $R^3$, $R^4$, $R^5$ and $R^6$ each independently designate a methyl group, a vinyl group, or a phenyl group, with the proviso that each molecule comprises at least 2 vinyl groups; and M, D, T and Q each represent a number ranging from 0 to less than 1, provided that M+D+T+Q is 1.

2. The thermally conductive silicone potting composition according to claim 1, wherein the content of the component (a) is from 1 wt % to 20 wt %, based on the total weight of the thermally conductive silicone potting composition.

3. A thermally conductive silicone potting composition including a first part and a second part;

the first part comprising:
(a) a vinyl organopolysiloxane,
(c) an alumina filler having an average particle diameter which is greater than or equal to 0.1 μm and less than 3 μm,
(d) an alumina and/or aluminum hydroxide filler having an average particle diameter which is greater than or equal to 3 μm and less than 15 μm,
(e) an alumina filler having an average particle diameter which is greater than or equal to 15 μm and less than or equal to 100 μm,
(f) a catalyst, and the second part comprising:
(b) a hydride organopolysiloxane,
(c) an alumina filler having an average particle diameter which is greater than or equal to 0.1 μm and less than 3 μm,
(d) an alumina and/or aluminum hydroxide filler having an average particle diameter which is greater than or equal to 3 μm and less than 15 μm, and
(e) an alumina filler having an average particle diameter which is greater than or equal to 15 μm and less than or equal to 100 μm, wherein the component (b) is at least one organopolysiloxane B represented by the following general formula (2):

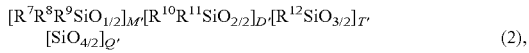

$[R^7R^8R^9SiO_{1/2}]_{M'}[R^{10}R^{11}SiO_{2/2}]_{D'}[R^{12}SiO_{3/2}]_{T'}[SiO_{4/2}]_{Q'}$     (2), wherein $R^7$, $R^8$, $R^9$, $R^{10}$, $R^{11}$ and $R^{12}$ each independently designate a methyl group, an ethyl group, a vinyl group, a phenyl group, or hydrogen, with the proviso that each molecule comprises at least 2 hydrogen atoms directly bonded to silicon; and M', D', T' and Q' each represent a number ranging from 0 to less than 1, provided that M'+D'+T'+Q' is 1.

4. The thermally conductive silicone potting composition according to claim 1, wherein the content of the component (b) is from 1 wt % to 20 wt %, based on the total weight of the thermally conductive silicone potting composition.

5. The thermally conductive silicone potting composition according to claim 1, wherein the total content of the components (c), (d) and (e) of the first and second parts is greater than 80 wt % and less than 98 wt %, based on the total weight of the thermally conductive silicone potting composition.

6. The thermally conductive silicone potting composition according to claim 1, wherein the total content of the component (c) of the first and second parts is from 4 wt % to 65 wt %, based on the total weight of the thermally conductive silicone potting composition.

7. The thermally conductive silicone potting composition according to claim 1, wherein the total content of the component (d) of the first and second parts is from 3 wt % to 45 wt %, based on the total weight of the thermally conductive silicone potting composition.

8. The thermally conductive silicone potting composition according to claim 1, wherein the component (d) of the first and second parts is an alumina filler having an average particle diameter which is greater than or equal to 3 μm and less than 15 μm.

9. The thermally conductive silicone potting composition according to claim 1, wherein the total content of the component (e) of the first and second parts is from 25 wt % to 70 wt %, based on the total weight of the thermally conductive silicone potting composition.

10. The thermally conductive silicone potting composition according to claim 1, further comprising (g) a silane coupling agent or titanium-based coupling agent.

11. A thermal potting adhesive containing the thermally conductive silicone potting composition according to claim 1.

12. An electronic component, which is potted using the thermally conductive silicone potting composition according to claim 1.

13. The thermally conductive silicone potting composition according to claim 3, wherein the content of the component (a) is from 1 wt % to 20 wt %, based on the total weight of the thermally conductive silicone potting composition.

14. The thermally conductive silicone potting composition according to claim 3, wherein the content of the component (b) is from 1 wt % to 20 wt %, based on the total weight of the thermally conductive silicone potting composition.

15. The thermally conductive silicone potting composition according to claim 3, wherein the total content of the components (c), (d) and (e) of the first and second parts is greater than 80 wt % and less than 98 wt %, based on the total weight of the thermally conductive silicone potting composition.

16. The thermally conductive silicone potting composition according to claim 3, wherein the total content of the component (c) of the first and second parts is from 4 wt % to 65 wt %, based on the total weight of the thermally conductive silicone potting composition.

17. The thermally conductive silicone potting composition according to claim 3, wherein the total content of the component (d) of the first and second parts is from 3 wt % to 45 wt %, based on the total weight of the thermally conductive silicone potting composition.

18. The thermally conductive silicone potting composition according to claim 3, wherein the component (d) of the first and second parts is an alumina filler having an average particle diameter which is greater than or equal to 3 μm and less than 15 μm.

19. The thermally conductive silicone potting composition according to claim 3, wherein the total content of the component (e) of the first and second parts is from 25 wt % to 70 wt %, based on the total weight of the thermally conductive silicone potting composition.

20. The thermally conductive silicone potting composition according to claim 3, further comprising (g) a silane coupling agent or titanium-based coupling agent.

21. A thermal potting adhesive containing the thermally conductive silicone potting composition according to claim 3.

22. An electronic component, which is potted using the thermally conductive silicone potting composition according to claim 3.

* * * * *